United States Patent [19]

Wang

[11] Patent Number: 5,694,106

[45] Date of Patent: Dec. 2, 1997

[54] SAFETY SWITCH WITH OVERLOAD PROTECTION CIRCUIT

[76] Inventor: Ming Shan Wang, No. 5, Alley 4, Lane 108, Tung Hsing St., Nankang Dist., Taipei City, Taiwan

[21] Appl. No.: 766,044

[22] Filed: Dec. 16, 1996

[51] Int. Cl.$^6$ ............................ H01H 71/04; H01H 71/16
[52] U.S. Cl. ............................ 337/79; 337/68; 337/72; 337/59; 337/53
[58] Field of Search ............................ 337/68, 59, 53, 337/72, 79, 37, 62, 75

[56] References Cited

U.S. PATENT DOCUMENTS

| 4,868,535 | 9/1989 | Janniere | 337/68 |
| 5,223,813 | 6/1993 | Cambreleng | 337/66 |
| 5,262,748 | 11/1993 | Tsung-Mou | 337/66 |
| 5,453,725 | 9/1995 | You | 337/68 |
| 5,526,225 | 6/1996 | Wang | 337/68 |
| 5,539,371 | 7/1996 | Yu | 337/66 |
| 5,541,569 | 7/1996 | Jang | 337/68 |

*Primary Examiner*—Leo P. Picard
*Assistant Examiner*—Stephen T. Ryan
*Attorney, Agent, or Firm*—Morton J. Rosenberg; David I. Klein

[57] ABSTRACT

An improved safety switch with overload protection circuit includes a housing having a lamp cover and three connecting plates disposed in a receptacle. One connecting plate is provided with a bi-metal plate having a platinum contact, and one is provided with a platinum contact corresponding to the bi-metal plate. When power is overload, the bi-metal plate will trip off so that an electrically insulating baffling plate may slip in between the platinum contacts to cut off power supply. The lamp cover is provided with a control hook which may control the bi-metal plate. The lamp cover further has a leg extending into an elongated notch of the baffling plate. By pressing the lamp cover, displacement of the bi-metal plate and the baffling plate may be controlled to achieve electrical connection or disconnection.

1 Claim, 9 Drawing Sheets (PRIOR ART)

FIG. 1

(PRIOR ART)

FIG.9 OFF

FIG.10 OFF (PRIOR ART)

F I G. 11(A)

F I G. 11(B)

SAFETY SWITCH WITH OVERLOAD PROTECTION CIRCUIT

BACKGROUND OF THE INVENTION (a) Field of the Invention:

The present invention relates generally to a safety switch with an overload protection circuit, and more particularly to a safety switch which may automatically turn off during power overload to ensure safety.

Figure 1:
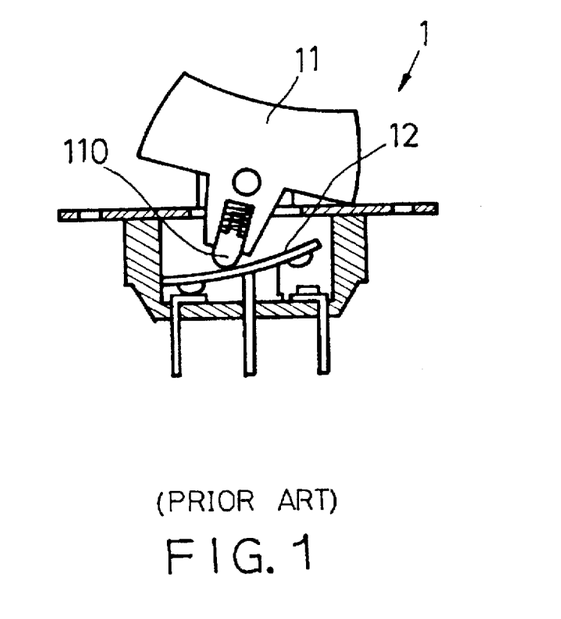
FIG. 1 is a schematic view of a prior see-saw switch.

(b) Description of the Prior Art:

A conventional electrical switch 1 is shown in FIG. 1. It is a see-saw switch in which when either one end of a press block 11 is pressed, a stop block 110 at its bottom side will push an elastic contact plate 12 to connect or disconnect electric currents. In such a passive switch construction, every switching is controlled manually by pressing the press block 11. During power overload, the switch, when on, will not automatically turn off to cut off power supply, which is likely to lead to burnt fuse and, even worse, fire accidents.

Figure 2:
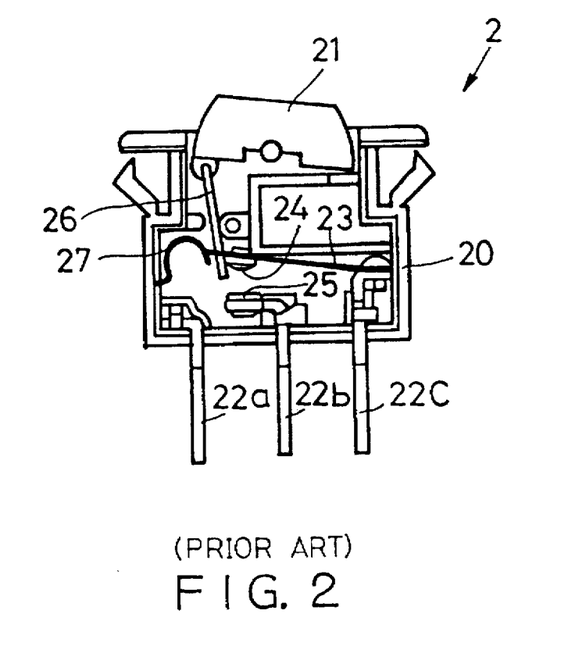
FIG. 2 is a schematic view of the switch structure disclosed in U.S. Pat. No. 5,262,748.

Reference is made FIG. 2, which shows an electrical switch disclosed in U.S. Pat. No. 5,262,748 directed to the elimination of the drawbacks with the prior art. The electrical switch described in that patent essentially comprises a combination housing 20 having a press block 21 pivotally provided at an upper end thereof and three connecting plates 22a, 22b and 22c located at a bottom side thereof. Two of the contacts are respectively provided with a contact reed 23 and platinum contacts 24, 25. The contact reed 23 has one end located above the connecting plate 22b and in contact with the platinum contact 25 thereon. A link piece 26 has one end disposed at the bottom side of one end of the press block 21 and the other end connected to the contact reed 23. When the press block 21 is pressed, the two connecting plates 22b and 22c connecting to the power supply cables will make the electrical connection via the contact reed 23 and the platinum contacts 24, 25. When power is overload, the curvature of the contact reed 23 changes so that it leaps off from the platinum contact 25, cutting off the power supply to ensure safety.

There are however the following drawbacks with the electrical switch disclosed in U.S. Pat. No. 5,262,748:

1. When the press block 21 is pressed or stuck, or the curved elastic piece 27 suffers from metal fatigue, the contact reed 23 (bi-metal plate) cannot trip off the platinum contact 25 when power is overload. With the continual rise in temperature, the switch body may melt, which is very dangerous.

2. During power overload, generally within the range between 100° C. and 150° C., the contact reed 23 made of bi-metal may have a resilience greater than that of the curved elastic piece 27 so that it automatically jumps to "off." At this point, if the press block 21 is pressed to "on," and if the contact reed 23 sustains a greater resilience than the curved elastic piece 27, then the platinum contacts 24 and 25 will jump back to "off" after contact. If the press block 21 is pressed to force the contact reed 23 to contact the platinum contacts 24, 25, the temperature will continue to rise since the contact reed 23 has lost its function. And in the case of forced contact, if the force applied is not uniform, sparks may be generated upon slight contact (due to alternating power overload and poor electrical contact). As a result, the platinum contacts 24 and 25 may become oxidized easily, shortening their life.

U.S. Pat. No. 5,526,225 issued to the inventor of the present invention discloses a receptacle with lamp switch and breaker means and is directed to improving existing electrical switches. The present invention is therefore aimed to provide further improvements on electrical switches.

SUMMARY OF THE INVENTION

Accordingly, a primary object of the present invention is to provide a safety switch with an overload protection circuit, wherein a bi-metal plate is processed to have a convex shape and is subjected to thermal treatment to eliminate its stress, so that when electric currents flow therethrough, by means of the bi-metal plate having varying resistance and applying the formulae where V=IR and W=VA, the bi-metal plate will automatically become concave in shape when the temperature causes its surface to deform; and an electrically insulating baffle piece will automatically insert into a clearance formed when the bi-metal plate changes shape so as to put the switch to an off state, thus ensuring safety.

Another object of the present invention is to provide a safety switch with an overload protection circuit in which a control hook at a front end of a lamp cover may be utilized to pull a bi-metal plate so that an electrically insulating baffle piece may, by means of a spring provided at a tail end thereof, insert between two platinum contacts to switch to an off state to ensure safety.

A further object of the present invention is to provide a safety switch with an overload protection circuit in which a protrudent leg at a lateral side of a lamp cover may be utilized to pull an electrically insulating piece to disengage from two platinum contacts so as to switch to an on state.

BRIEF DESCRIPTION OF THE DRAWINGS

The foregoing and other features and advantages of the present invention will be more clearly understood from the following detailed description and the accompanying drawings, in which.

DETAILED DESCRIPTION OF THE PREFERRED EMBODIMENT

With reference to FIGS. 3–6, the safety switch with overload protection circuit, according to the present invention essentially comprises a housing 3, a lamp cover 4, a receptacle 5, a bi-metal plate 6, a circuit board 7 and an electrically insulating baffling plate 8.

Figure 3:
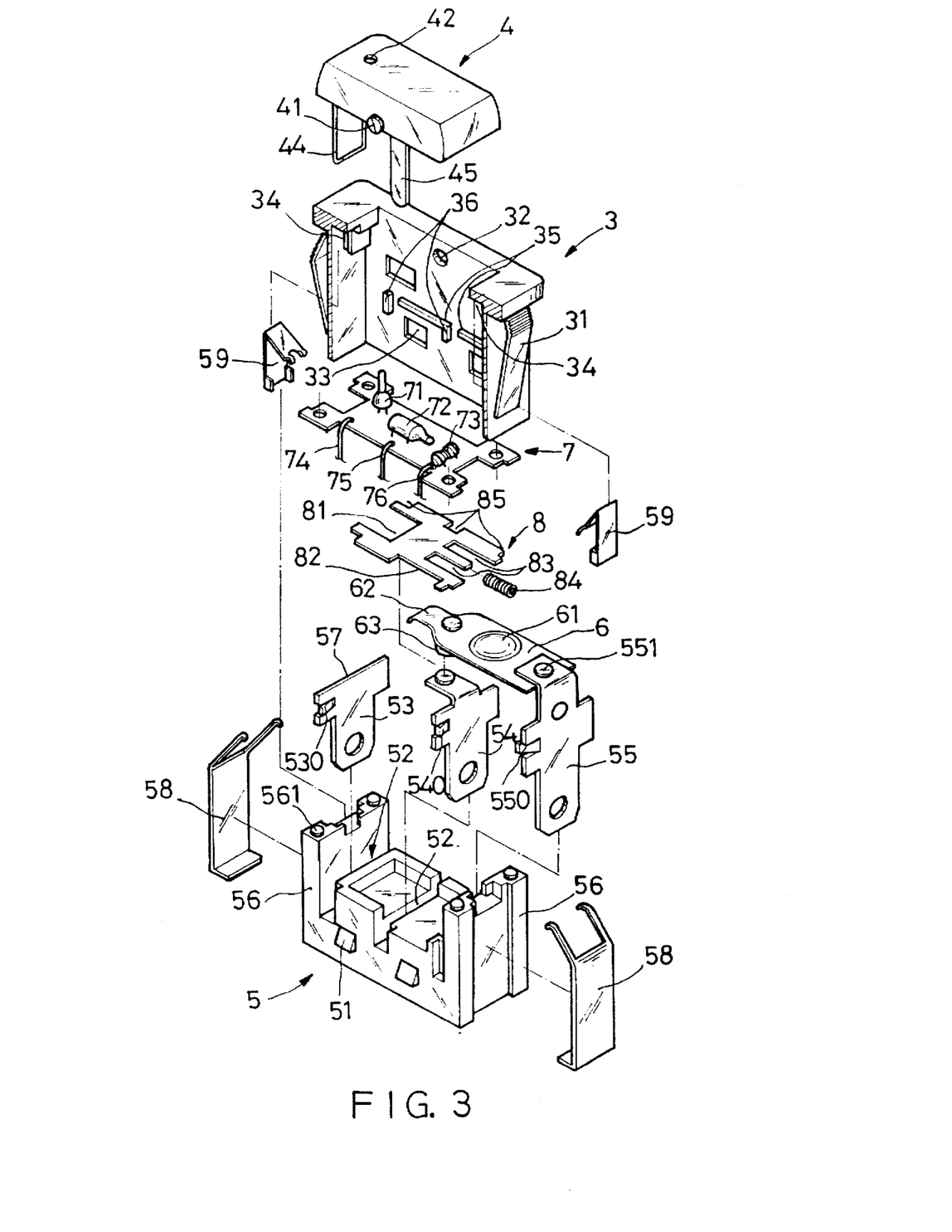
FIG. 3 is an elevational exploded view of a preferred embodiment of the present invention.

The housing 3 is substantially hollow having an elastic stop hook 31 at both the front and the rear sides thereof, and a positioning hole 32 at each lateral side.

The lamp cover 4 is provided with a nose 41 at either lateral side for engaging the positioning hole 32 of the housing 3 so that the lamp cover 4 may be pivotally mounted on the upper side of the housing 3 for pressing purposes. The lamp cover 4 is further provided with a through hole 42 at its upper side.

The receptacle 5 is provided with a plurality of lugs 51 at each lateral side for engaging a plurality of retaining slots 33 correspondingly provided at each side of the housing 3 when the receptacle 5 is inserted into the interior of the housing 3 via the bottom side thereof. The receptacle 5 has provided thereon three insert grooves 52 for receiving three connecting plates 53, 54 and 55. An upper end of the connecting plate 55 at the side is bent and connected to the bi-metal plate 6 by means of a rivet 551. The central portion of the bi-metal plate 6 is punched so that it projects upwardly in the shape of a saucer 61. The bi-metal plate 6 further has a front end extending forwardly to form a hook element 62, and a platinum contact 63 is secured at a bottom side of the front end. The connecting plate 54 in the middle also has a bent upper end and is provided with a platinum contact 57 at a position corresponding to the platinum contact 63 on the bi-metal plate 6. In addition, the three connecting plates 53, 54, and 55 are each provided with a punched out fork-shaped connecting portion 530, 540, 550 at a lateral side thereof. The front and rear sides of the receptacle 5 extend upwardly to form respective vertical portions 56 each of which is provided with a protrusion 561 at either corner. A first metallic elastic piece 56 is further fitted onto the respective front and rear sides of the receptacle 5. A second metallic elastic piece 59 of a bent shape is then disposed above the respective front and rear sides of the receptacle 5. An upper portion of the second metallic elastic piece 59 is retained in a recess 34 at an inner side of the respective front and rear sides of the housing 3.

The circuit board 7 includes four round holes 70 at four corners for engaging the protrusions 561 at the top side of the receptacle 5. The circuit board 7 has arranged thereon a neon light 71, an LED indicator 72 and a resistor 73. Three electrical wires 74, 75 and 76 from the circuit board 7 are respectively connected to the three connecting portions 530, 540 and 550 of the three connecting plates 53, 54 and 55. When the connecting plates 54 and 55 at the right side and in the middle are connected, the neon light 71 will be on to indicate electrical connection, while the LED indicator 72 normally serves as a night light.

The electrically insulating baffling plate 8 is disposed between the two platinum contacts 63 and 57.

The present invention is characterized in that the middle section of the inner side of each lateral side of the housing 3 is provided with a plurality of horizontal ribs 35 and vertical ribs 36 respectively for positioning the baffling plate 8 and the connecting plates 53, 54 and 55.

The lamp cover 4 has a block43 disposed inside the front end for pivotally mounting a control hook 44 having a bottom end located at the bottom edge of the hook element 62 of the bi-metal plate 6. Furthermore, a leg 45 extends downwardly from one lateral side of the lamp cover 4.

The baffling plate 8 is located between the two vertical portions 56 of the receptacle 5 such that it may displace thereon. The upper portions of the lateral sides thereof are positioned by the horizontal ribs 35 of the housing 3. The baffling plate 8 is further provided with an indentation at its front end for accommodating the control hook 44, and an elongated notch 82 at a suitable position for insertion of the leg 45 of the lamp cover 4. Furthermore, the center of the rear end of the baffling plate 8 is provided with two guide grooves 83 on either side of a projection onto which a spring 84 fits. At positions corresponding to those of the vertical ribs 36 of the housing 3, the baffling plate 8 is provided with matching notches 85 so that its forward and rearward displacement may not be hindered by the vertical ribs 36.

During power overload, the bi-metal plate 6 will automatically leaps off and the baffling plate 8 will automatically come into between the two platinum contacts 63 and 57. Alternatively, the lamp cover 4 may control the baffling plate to displace.

Figure 4:
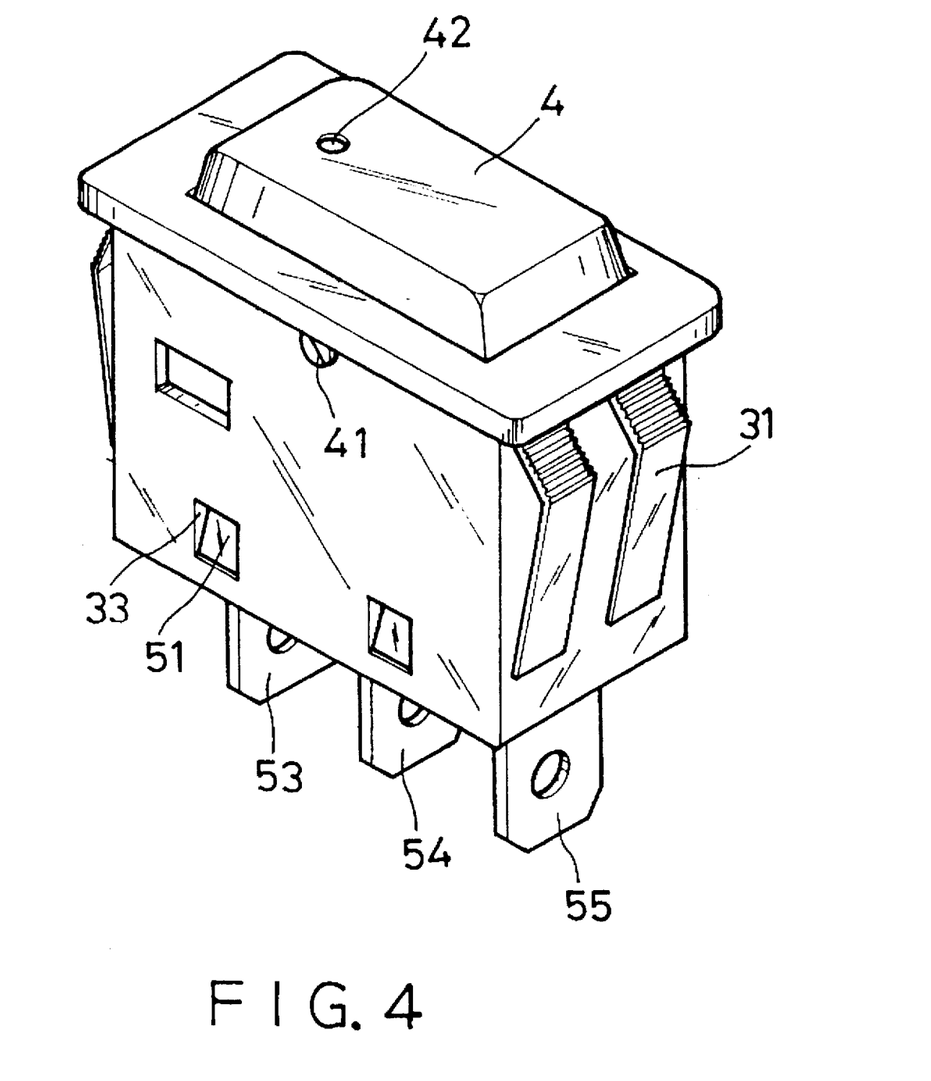
FIG. 4 is an outer view of the preferred embodiment of the present invention.
Figure 4A:
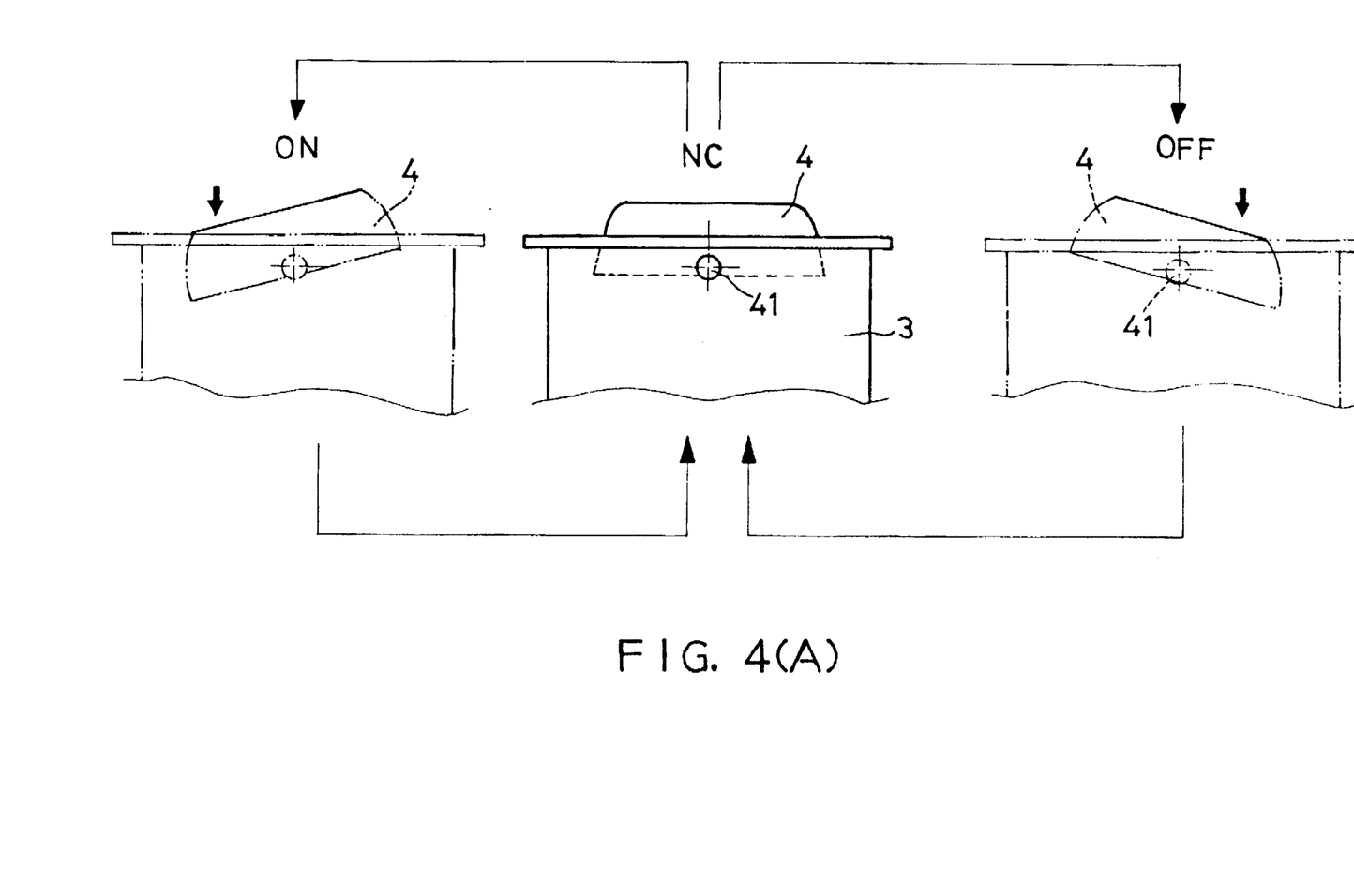
FIG. 4A is a schematic view illustrating the lamp cover when being pressed.

The above-mentioned first and second metallic elastic pieces 58 and 59 are arranged to provide resilience when the lamp cover 4 is pressed and to allow resetting after pressing. As shown in FIG. 4A, under normal conditions (NC), the lamp cover 4 is in a level position and pivotally connected onto the housing 3. When it is pressed to switch to an on or off state, it will resume its level NC position. As such a structure belongs to the prior art, it will not be discussed in detail herein.

Furthermore, in order to match the interior of the housing 3 and the receptacle 5, it should be understood that the circuit board 7 has to be provided with a plurality of notches at its periphery to facilitate assembly and allow normal operation of relating structural elements.

Description of the invention in practice and the achievable effects is provided below.

Figure 5:
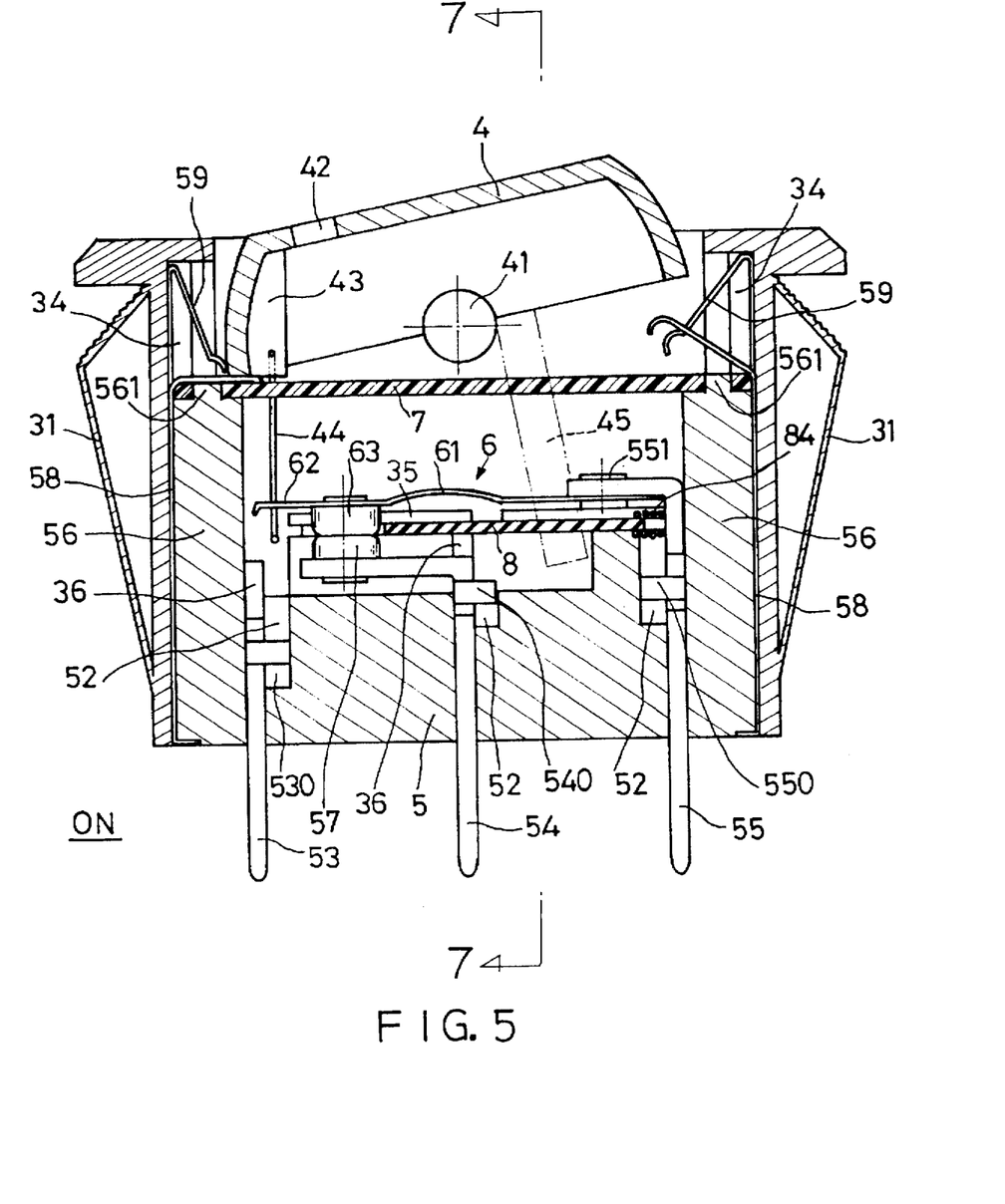
FIG. 5 is a sectional view of the present invention, showing the switch in an on state.
Figure 6:
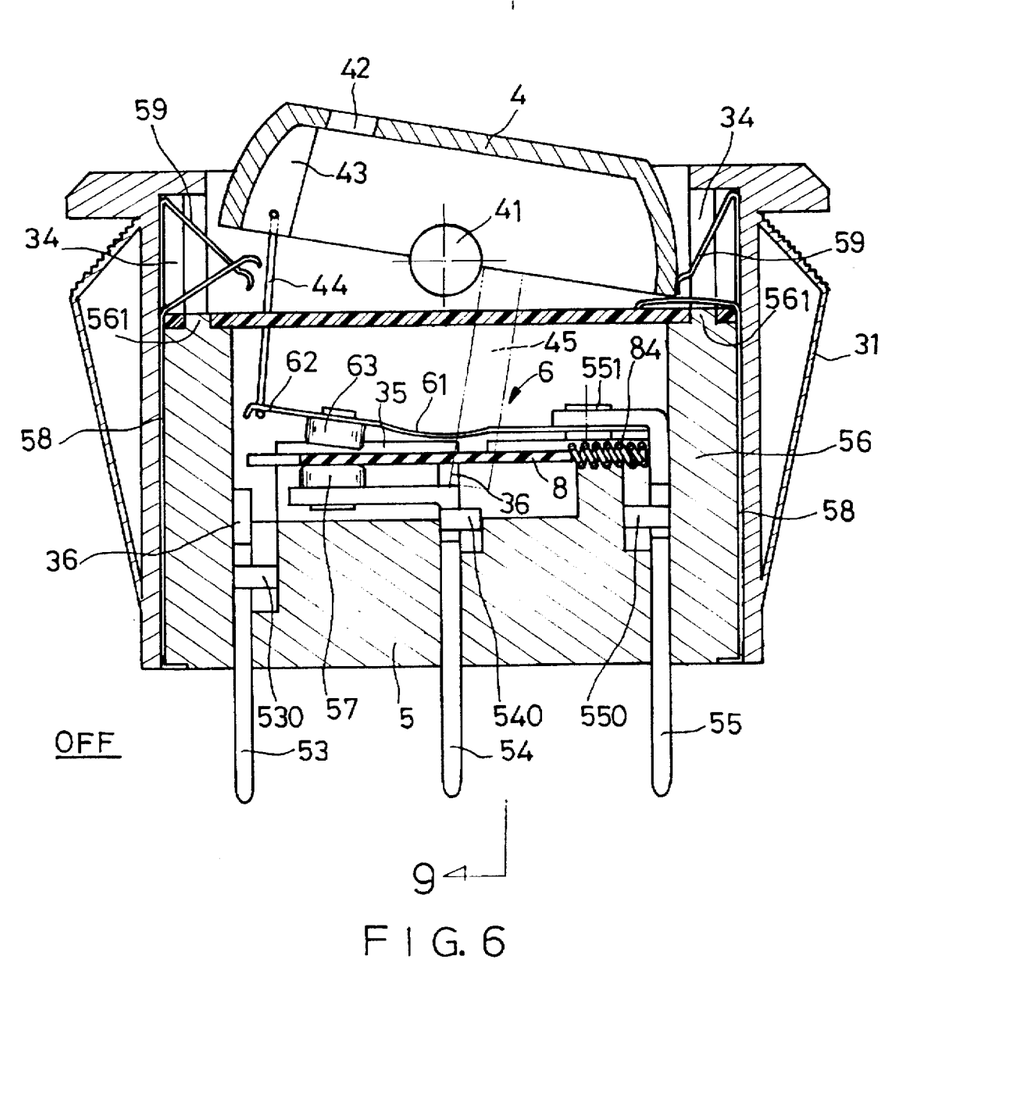
FIG. 6 is a sectional view of the present invention, showing the switch in an off state.

With reference to FIG. 5, when the lamp cover 4 is pressed to switch to an on state, the platinum contact 63 of the bi-metal plate 6 contacts the platinum contact 57 of the middle connecting plate 54 and makes the electrical connection. The bi-metal plate 6 is made of two metals of different properties so that it may have varying resistance. By applying the principle that V=IR and W=VA, at normal temperatures, the saucer 61 at the center of the bi-metal plate 6 will be in a convex state. When power overloads and temperature rises, the saucer 61 will become concave as shown in FIG. 6. When the temperature drops, the saucer 61 will resume its convex shape. As for the time between each change in shape, it depends on the curvature of the saucer 61, generally between 20 and 30 seconds. As such a bi-metal plate 6 is known and may achieve the desired effects, and as it is not the object of the present invention, it will not be discussed in detail herein.

Figure 9:
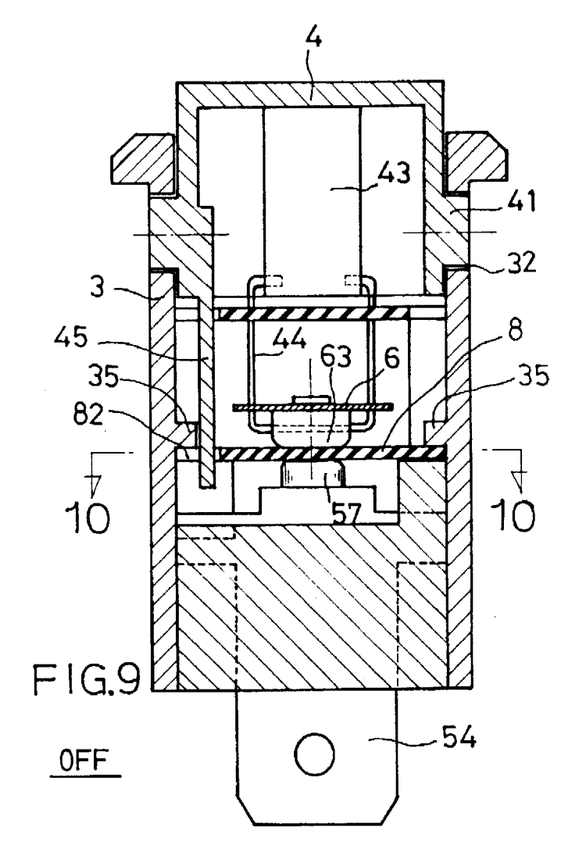
FIG. 9 is a schematic sectional view taken along line 9—9 of FIG. 6, showing the off state.
Figure 10:
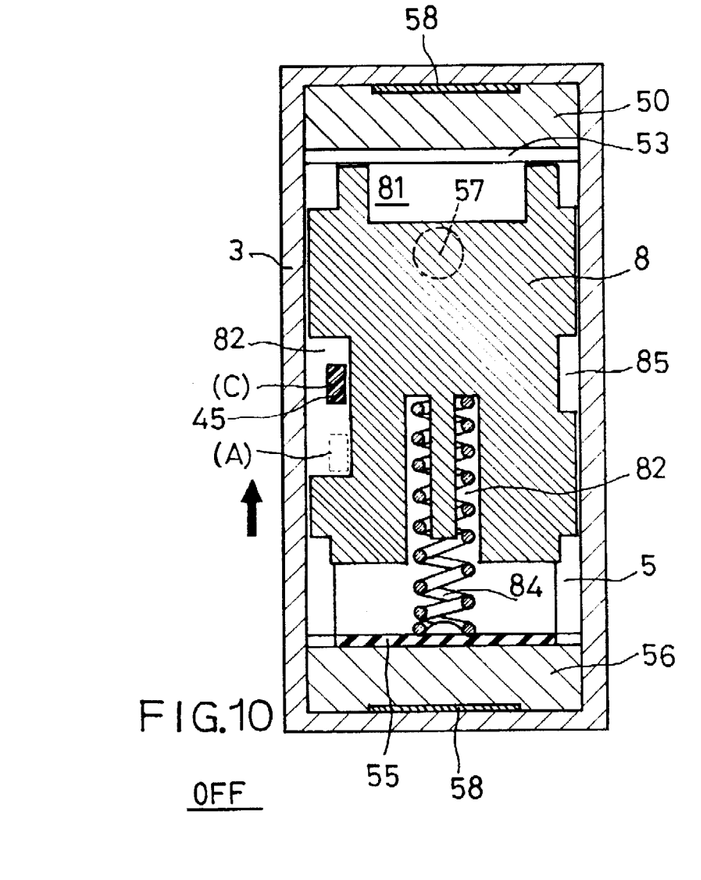
FIG. 10 is a schematic sectional view taken along line 10—10 of FIG. 10, showing the off state.

Referring to FIGS. 6, 9 and 10, a salient feature of the invention resides in the application of the baffling plate 8. When the bi-metal plate 6 becomes concave in shape due to power overload, a clearance is formed when the platinum contact 63 thereon disengages from the platinum contact 57 of the connecting plate 54. The baffling plate 8 may, by means of a forward thrust afforded by the spring 84 fitted at its rear end, automatically fit in between the two platinum contacts 63 and 57, cutting off the electric currents. Thereafter, even when the temperature of the bi-metal plate 6 has dropped and the bi-metal plate 6 resumes its convex shape, since the platinum contacts 63 and 57 are separated by the baffling plate 8, electrical connection is not possible. Such an arrangement is to prevent sudden on's and off's, which may shorten the life of the electrical switch.

Figure 7:
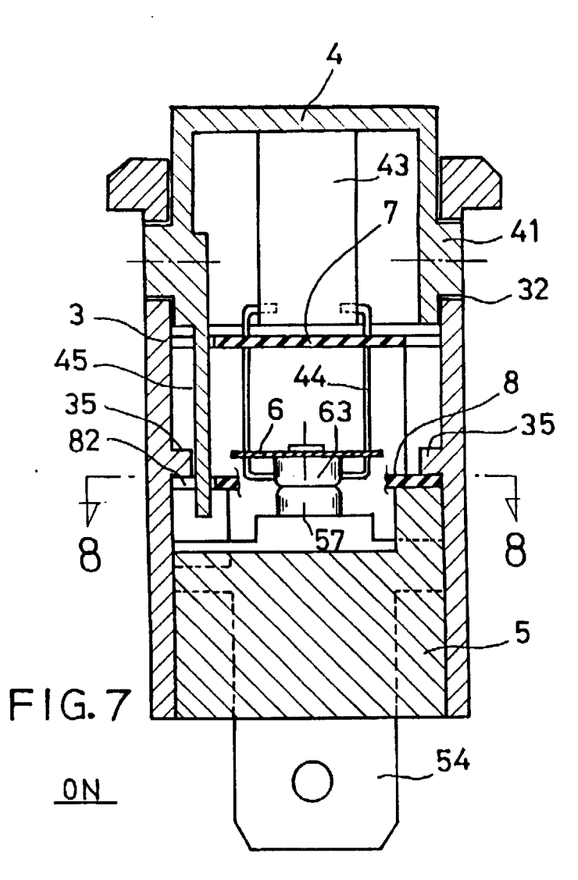
FIG. 7 is a schematic sectional view taken along line 7—7 of FIG. 5, showing the on state.
Figure 8:
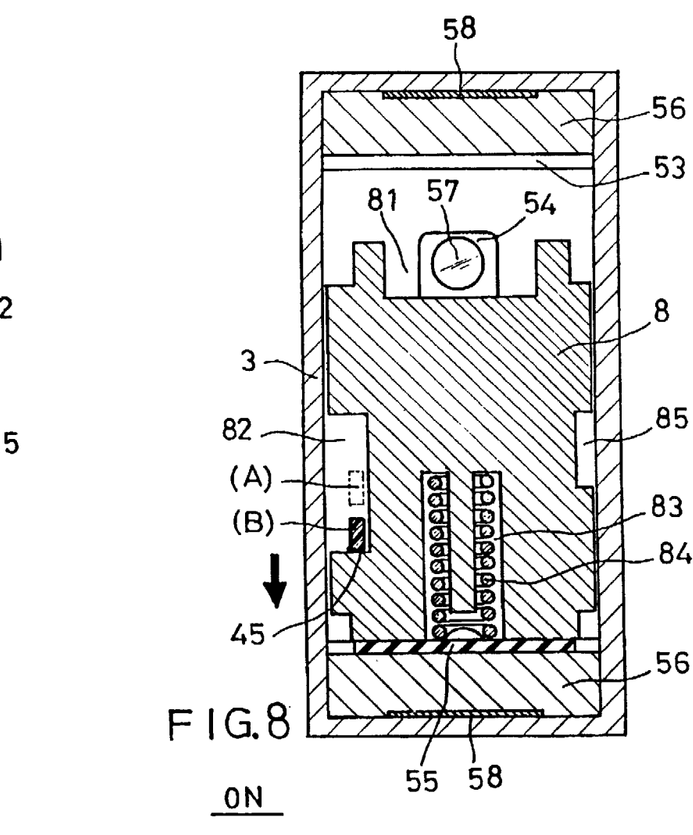
FIG. 8 is a schematic sectional view taken along line 8—8 of FIG. 6, showing the off state.

When the safety switch is in an off state due to the baffling plate 8 between the platinum contacts 63 and 57, in order to resume electrical connection, it will be necessary to press the lamp cover 4 so that it turns with the lugs 41 as pivots. When the lamp cover 4 is pressed forwardly, the leg 45 will displace rearwardly from an original point A to a point B, so as to drive the baffling plate 8 to slidably displace rearwardly. As shown in FIG. 8, when the baffling plate 8 presses the spring 84 to displace rearwardly, the baffling plate 8 between the platinum contacts 63 and 57 will move out so that the platinum contacts 63 and 57 contact each other again, as in FIGS. 5, 7 and 8. At this point, there is no need to press the lamp cover 4 forwardly, since the baffling plate 8 is blocked by the two contacting platinum contacts 63 and 57 despite the pressure exerted by the spring 84 at the rear end of the baffling plate 8. At this point, the lamp cover 4 resumes its level (NC) position and the leg 45 resumes to the A position.

Therefore, only under two situations can the electrical switch of the invention be put in an off state. The first is when the power is overload, forcing the bi-metal plate 6 to become concave due to high temperature, so that the baffling plate 8 may slip into the clearance formed during changes in the shape of the bi-metal plate 6. Second, when the lamp cover 4 is pressed so that it turns rearwardly with the control hook 44 at the front end lifts upwardly, bringing the hook element 62 at the front end of the bi-metal plate 6. When the bi-metal plate 6 is pulled up, the platinum contacts 64 and 57 disengage from each other, and the baffling plate 8 may, due to the resilience of the spring 84, slip into the clearance to separate the platinum contacts 63 and 57, as shown in FIGS. 6, 9 and 10. And when the lamp cover 4 is pressed rearwardly, the leg 45 will displace from the normal position A to the position C, as shown in FIG. 10, and will not drive the baffling plate 8, just displacing in the elongated notch 82, while the baffling plate 8 utilizes the resilience of the spring 84 to slip in between the platinum contacts 63 and 57. When the lamp cover 4 resumes its NC level position, the leg will reset to the position A.

Figure 11A:
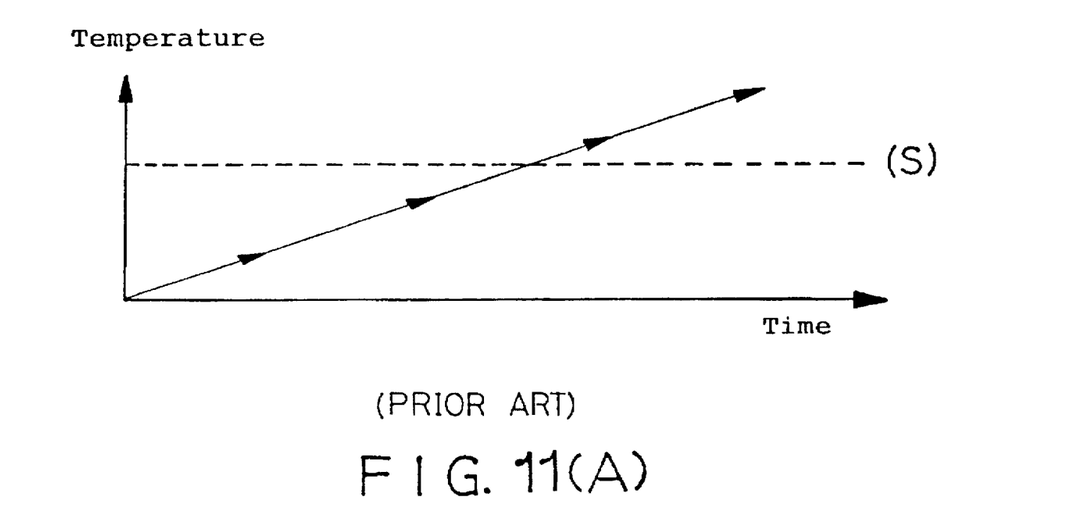
FIG. 11A and FIG. 11B are comparative graphs showing the changes in temperature in the present invention and the prior art.
Figure 11B:
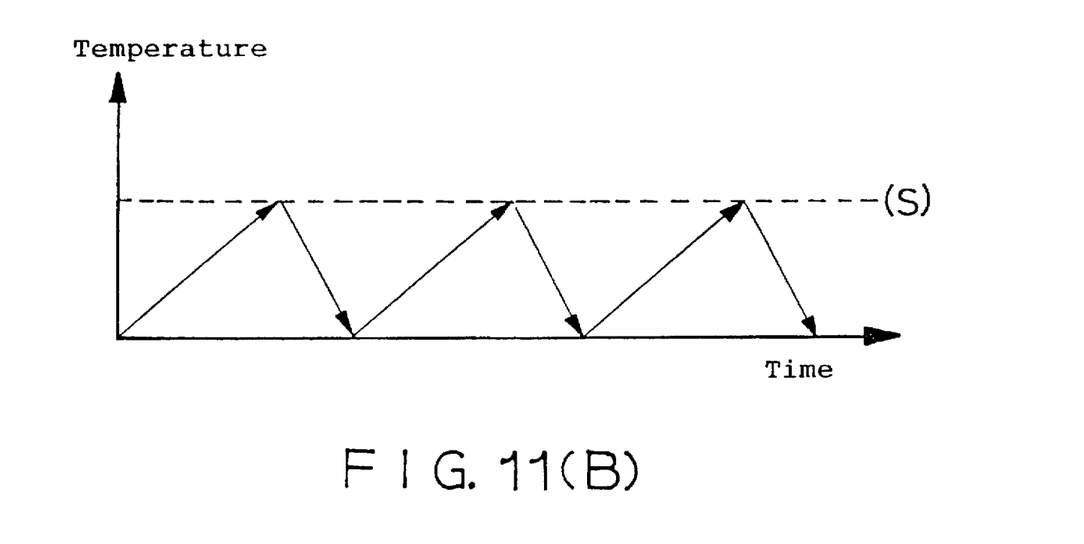

According to the structure of the safety switch of the invention described above, the biggest difference between the subject invention and the safety switch 2 disclosed in U.S. Pat. No. 5,262,748 when in use is that, when the press block 21 is pressed by an external force or stuck, or the curved elastic piece 27 is fatigue, the contact reed 23 may be pressed during overload so that it may not trip off. At this point, the curved elastic piece 27 will be ineffective and, quite on the contrary, becomes a potentially dangerous heater. And the temperature, referring to FIG. 11a, continues to rise, which may lead to burning of the switch body. Whereas, in the present invention, if the lamp cover 4 or the baffling plate 8 is ineffective, when the temperature has reached a set temperature S, the hi-metal plate 6 will automatically trip off and cut off power supply, so that the baffling plate 8 cannot slip in between the platinum contacts 63 and 57. After the temperature has dropped, the bi-metal plate 6 will resume its original position and connect electricity. Therefore, the temperature is shown in FIG. 11B to rise and then drop, and the switch is in an off and then on state. The ni lamp 71 at this time will flicker, indicating that the switch is in trouble. Hence, even if the switch is in trouble, there is only intermittent "on's" and "off's," without sustained power overload. Therefore, in comparison with the safety switch 2 taught in the U.S. Pat. No. 5,262,748, the present invention provides much improved effects and ensures absolute safety.

In summary, the switch of the invention has a breaker which will automatically snaps during power overload, and has ordinary switching functions. By means of the arrangement of the control hook 44 and the leg 45 of the lamp cover 4 and the special configuration of the bi-metal plate 6 and the baffling plate 8, accidents may be effectively prevented during power overload. Furthermore, When the temperature of the bi-metal plate 6 drops, unless the press cover 4 is pressed anew, the switch will not automatically become on, ensuring safety and prolonging the life of the switch.

Although the present invention has been illustrated and described with reference to the preferred embodiment thereof, it should be understood that it is in no way limited to the details of such embodiment but is capable of numerous modifications within the scope of the appended claims.

What is claimed is:

1. An improved safety switch with overload protection circuit, comprising:

a housing, said housing being substantially hollow and provided with an elastic stop hook at a front side and a rear side thereof respectively, and a positioning hole at either lateral side thereof;

a lamp cover, said lamp cover having a nose at either lateral side thereof for engaging said positioning hole of said housing, so that said lamp cover may be pivotally mounted on an upper side of said housing for pressing purposes, said lamp cover further having a through hole at an upper side thereof;

a receptacle, said receptacle having a plurality of lugs at either laterals side thereof for engaging a plurality of retaining slots correspondingly provided at each lateral side of said housing when said receptacle is inserted into the interior of said housing via a bottom side thereof, said receptacle having provided thereon three insert grooves for receiving three connecting plates; an upper end of that connecting plate at the side being bent and connected to a bi-metal plate by means of a rivet, .a central portion of said bi-metal plate being punched so that it projects upwardly in the shape of a saucer, said bi-metal plate having a front end extending forwardly to form a hook element, and a platinum contact being secured at a bottom side of said front end; that connecting plate in the middle also having a bent upper end and being provided with a platinum contact at a position corresponding to said platinum contact on said bi-metal plate 6; said three connecting plates each being provided with a punched out fork-shaped connecting portion at a lateral side thereof; said receptacle further having a front side and a rear side thereof extending upwardly to form respective vertical portions each of which is provided with a protrusion at either corner, and a first metallic elastic piece being fitted onto the respective front and rear sides of said receptacle, while a second metallic elastic piece of a bent shape is disposed above the respective front and rear sides of said receptacle such that an upper portion of said second metallic elastic piece is retained in a recess at an inner side of the respective front and rear sides of said housing;

a circuit board, said circuit board having four round holes at four corners thereof for engaging said protrusions at the top side of said receptacle and having arranged thereon a neon light, an LED indicator and a resistor, three electrical wires from said circuit board being respectively connected to said three connecting portions of said three connecting plates such that when said connecting plates at the right side and in the middle are connected, the neon light will be on to indicate electrical connection; and an electrically insulating baffling plate disposed between said platinum contacts, wherein a plurality of horizontal ribs and a plurality of vertical ribs are arranged at a middle section of the inner side of each lateral side of said housing for positioning said baffling plate and said connecting plates respectively;

said lamp cover has a block disposed inside said front end thereof for pivotally mounting a control hook having a bottom end located at a bottom edge of said hook element of said bi-metal plate, and said lamp cover further has a leg extending downwardly from one lateral side thereof; and said baffling plate is located between said two vertical portions of said receptacle such that it may displace thereon; the upper portions of the lateral sides thereof are positioned by said horizontal ribs of said housing; said baffling plate is further provided with an indentation at its front end for accommodating said control hook and an elongated notch at a suitable position for insertion of said leg of said lamp cover therethrough; the center of the rear end of said baffling plate is further provided with two guide grooves on either side of a projection onto which a spring fits; and said baffling plate is provided with matching notches at positions corresponding to those of said vertical ribs of said housing so that its forward and rearward displacement may not be hindered by said vertical ribs, whereby when power is overload, said bi-metal plate may trip off so that said baffling plate may automatically slip in between said platinum contacts, or said lamp cover may be utilized to control said baffling plate to displace to cut off power supply.

* * * * *